ALLOY-DIFFUSION PROCESS FOR FABRICATING GERMANIUM TRANSISTORS

Original Filed May 22, 1962

GORDON J. RATCLIFF
& MELVIN BELASCO
INVENTORS
BY John D. Graham
ATTORNEY 3,268,375

ALLOY-DIFFUSION PROCESS FOR FABRICATING GERMANIUM TRANSISTORS

Gordon J. Ratcliff, 537 Ridgedale, Richardson, Tex., and Melvin Belasco, Apt. 247, 6836 Twin Hills, Dallas, Tex.
Original application May 22, 1962, Ser. No. 196,695. Divided and this application Mar. 29, 1965, Ser. No. 443,259
11 Claims. (Cl. 148—178)

This application is a division of Serial No. 196,695, filed May 22, 1962.

This invention relates to transistors and the fabrication thereof, and more particularly to mesa germanium transistors and processes for producing such devices.

In the manufacture of high-frequency germanium transistors, steady-state operating characteristics often must be sacrificed in order to obtain additional improvements in high-frequency performance. In conventional and known mesa diffused-base alloyed emitter structures a practical limit is reached in efforts to obtain extremely low base resistance ($r'b$) and collector-base time constants ($r'bCc$). This is evidenced in greatly reduced forward current gains in common emitter configurations and extremely poor reverse leakage characteristics of emitter diodes. Conversely, in some applications, a high emitter reverse breakdown is desired in conjunction with a relatively low base resistance. It is an object of the present invention to provide mesa transistors which give an additional degree of freedom in accomplishing the latter requirement and which allow greater flexibility in obtaining extremely low base resistance before degradation of static parameters becomes acute.

Among other objects of the present invention may be noted the provision of mesa germanium transistors which allow a better compromise between emitter-base junction breakdown and base resistance as well as improved high-frequency performance without significant sacrifice in the steady-state electrical operating characteristics of the device; the provision of such transistors in which the base resistance is quite independent of emitter-base diode breakdown voltage ($BV_{EBO}$) and therefore permits a much higher emitter-base breakdown voltage with a much lower $r'b$ than was heretofore possible; the provision of transistors of the type described in which $r'b$ is independent of the static forward current transfer ratio ($h_{fe}$) and is substantially independent of $fT$ considering $fT$ as being the frequency at which the absolute value of short circuit, small signal, common-emitter, forward current transfer ratio, or $|h_{fe}|$, extrapolates to unity where $fT$ may be up to approximately 600 mc.; the provision of such transistors which have much tighter frequency distributions for a given parameter and therefore allow a potentially higher yield; and the provision of processes for fabricating such devices which have good repeatability and are quite flexible in their application to the fabrication of many different mesa device types, including high-frequency power amplifiers, UHF transistors, PNP saturating switches and various consumer devices. Other objects and features will be in part obvious and in part pointed out hereinafter.

The invention accordingly comprises the structures and methods hereinafter described, the scope of the invention being indicated in the following claims.

In the accompanying drawings, in which several of various possible embodiments of the invention are illustrated, FIGURE 1 is a view in elevation of a wafer of P-type germanium prepared for fabrication of a novel mesa type germanium transistor in accordance with a process of the present invention;

Corresponding reference characters indicate corresponding parts throughout the several views of the drawings.

Figures 1, 2, 3, 4, 5, 6, 7, 8:
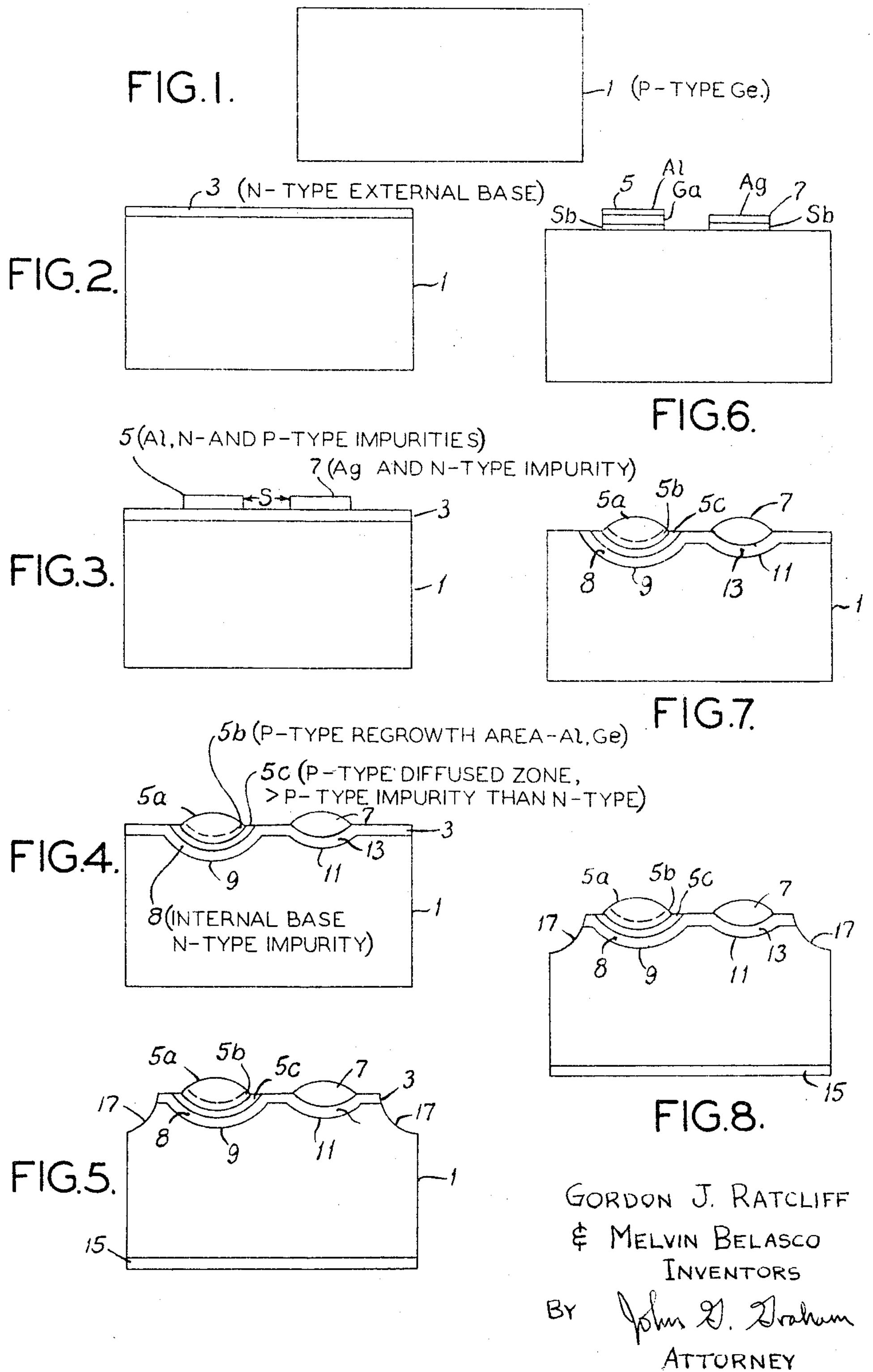
FIGURE 2 is a view of the wafer of FIGURE 1 after an initial process step of forming an external N-type base has been performed.
FIGURE 3 illustrates a subsequent step in our method in which emitter and base contact compositions are applied to adjacent surface portions of the wafer of FIGURE 2.
FIGURE 4 shows a cross section of the wafer of FIGURE 3 after an alloy diffusion step of this invention has been performed.
FIGURE 5 is a cross sectional view of the FIGURE 4 structure after a mesa etching step and application of a collector contact layer to the underside of the wafer.
FIGURE 6 illustrates a step in an alternate process of the present invention in which emitter and base contact compositions are applied to adjacent surface portions of the wafer of FIGURE 1.
FIGURE 7 illustrates a cross section of the wafer of FIGURE 6 after an alloy diffusion step of this process embodiment has been completed.
FIGURE 8 is a cross section of the FIGURE 7 wafer showing it after subsequent steps of mesa etching and application of a collector contact layer to the underside of the wafer.

In essence, the processes of the present invention include a sequence of novel steps in the fabrication of a mesa germanium transistor. Initially, a wafer of P-type germanium has applied to one portion of one of its faces a first composition which will subsequently form an emitter contact, an emitter and an internal base. This first composition includes aluminum as a major constitutent and both P-type and N-type impurities for the germanium. The N-type impurity has the property of more rapidly diffusing into the germanium than does the P-type impurity or dopant. A second composition, which will subsequently form a base contact and which composition includes silver and an N-type impurity, is applied to a second portion of the same wafer surface at a position closely adjacent but spaced from the first portion. The assembly of the wafer and the adjacent but spatially separated contact compositions is then heated to a temperature to form an alloy of the impurities, aluminum and germanium. Thereupon an alloy discussion results in which the faster diffusing impurity forms an N-type diffusion front which penetrates into the germanium substrate and constitutes upon cooling an internal base layer. A P-type region is simultaneously formed which is in contact with and superposed on this base layer and comprises an emitter. Simultaneously the base contact composition melts and diffuses into the wafer to form an N-type region which penetrates into the substrate and which has a base contact superposed thereon. Preferably the wafer has a thin N-type conductivity layer, which constitutes an external base, initially formed on the surface on which the two compositions are applied.

The resulting wafers, after conventional mesa etching, applying a collector contact layer, dicing, and lead application, etc., constitute alloy-diffused mesa type germanium transistors of the present invention which have highly advantageous characteristics and properties such as referred to above.

The starting material for the processes of the present invention is a slice of P-type germanium. Typically, a square of about 1" x 1" cut and chemically polished to a thickness of about 4 mils is utilized. The resistivity (bulk) of the starting material may vary considerably, e.g., between 0.06 ohm-cm. to 3.5 ohm-cm. If a fast (i.e., less than about 150 manoseconds) switching device is the desired end product, P-type germanium having a resistivity of about 0.06 ohm-cm. is selected, while a somewhat higher resistivity, such as in the order of 0.5 to 2 ohm-cm., would be chosen if the transistor to be fabricated is to be used as an amplifier. The crystal orientation of the starting material is preferably in the 1–1–0 or 1–0–0 planes, although material with a 1–1–1 orientation has been used with somewhat decreased success. Epitaxial germanium has also been used.

Referring now to the drawings, a wafer of this P-type germanium starting material is indicated in FIGURE 1 at reference character 1. The next step, which is preferred but optional, is to form a thin external N-type base layer 3 on the upper surface of the P-type germanium substrate. This is conveniently accomplished by diffusion with an N-type dopant or impurity (such as antimony, arsenic or phosphorus) in a two-zone diffusion furnace, as known to those skilled in this art, by placing the wafer in one zone and the source of the N-type impurity in the other. In such a furnace, the temperature in the wafer-containing zone would be maintained at about 700° C. while the zone having the impurity material would be maintained at about 350°–450° C. The two-zone diffusion may be done in a closed tube or in a flow process where an inert gas or hydrogen is passed over the N-dopant material to transport it in the vapor phase to the germanium wafers or slices. The diffusion times are in the order of 10–90 minutes, 30 minutes being typical. This preferred prediffusion step provides a thin external base 3 of less than 0.1 mil depth, preferably about 0.05 mil. Sheet resistivities after prediffusion may be varied considerably, e.g. 6 ohms/□ to 800 ohms/□. The resistivity of the starting material, as indicated above, and the type and sheet resistivities of the prediffusion depend on the desired final device, i.e., if an amplifying device is being fabricated the sheet resistivity of the diffused layer 3 should be between about 9–50 ohms/□ while 200–400 ohms/□ is preferred for a fast switch device.

FIGURE 3 exemplifies and illustrates the next step in this process during which an emitter, emitter contact and an internal base forming composition or material 5 is applied to a first portion of one surface of wafer 1 and a base contact composition or material 7 is applied to a second portion of this same wafer face, closely adjacent but spaced a small distance away from the first portion. The first or emitter composition includes between about 20–80% by weight of aluminum, about 0.2–20% by weight of a fast diffusing N-type impurity or dopant (preferably antimony, but arsenic and phosphorus may also be used), and about 0.01–10% by weight of a P-type dopant (viz., gallium or indium or both) that has a slower rate of diffusion into the germanium than that of the N-type dopant. If the aluminum percentage in this composition 5 is less than approximately 70%, a fourth component, silver, is added, so that the total concentration of the aluminum and silver is in the order of 70–99% by weight of the emitter material and the concentration of the aluminum is at least 20% of the total composition. Aluminum is the major constituent in composition 5, even if the percentage composition of the optional silver component is several times greater than that of the aluminum, inasmuch as aluminum will still provide twice the alloy penetration as silver in the subsequent alloy diffusion step. Thus aluminum is the major constituent because of its dissolution of germanium for alloy penetration. The aluminum functions principally as a carrier metal, i.e., it carries the N- and P-type impurities and has the important property of being readily able to dissolve germanium. Because its solid solubility in germanium is $\approx 4\times10^{20}$ cm.$^{-3}$ aluminum will also serve as the major acceptor constituent in the emitter regrowth area of the emitter to be subsequently formed. The gallium or indium or combination thereof constituent is believed to be the majority P-type diffusing impurity during subsequent formation of the emitter-base diode and also has the important function of inhibiting or suppressing the formation of aluminum antimonide (or arsenide, if this is used as the faster diffusing N-type impurity in the emitter composition 5) and thereby insures the presence of free antimony in the emitter melt in the next process step.

The emitter and emitter contact material 5 is applied as a small dot or stripe (in the order of 0.5–2 mils x 1.5–6 mils) by evaporation. For example, a pellet with the desired percentage composition of aluminum, N- and P-type impurities and silver may be evaporated in conventional apparatus to deposit on the surface of wafer 1 (through an indexable mask) the correct size strip or dot of composition 5. Because of the relative vapor pressures of aluminum, gallium and antimony, these elements will deposit in the inverse order on the surface of substrate 1, i.e., antimony first, then gallium, and then aluminum. Another method, which is particularly useful when the N- and P-type impurity concentrations or components vary, is separate, controlled, sequential evaporation of each element so that superimposed layers of the components of the emitter material 5 are applied in the desired order of the N-type first, followed by the P-type impurity, and finally by a layer of aluminum.

After material 5 has been deposited, the base contact composition material 7 is similarly deposited on the second portion of the surface of the external base layer 3 of wafer 1. This is accomplished by reindexing the mask to a position so that a stripe or dot of composition 7 will be spaced about 0.5–2 mils away from the stripe of composition 5. The base contact material is formed from silver and antimony with the antimony concentration being in the range of about 0.5–5% by weight. In fabricating devices, such as used in fast switching, up to about 50% by weight of the silver constituent of this second or base contact material may be advantageously replaced by gold, e.g., 10% gold, 85% silver and 5% antimony. The evaporation of the base contact material 7 as well as that of emitter material 5 is preferably from a heated tantalum or tungsten filament and is generally upward, the wafer 1 being above the filament with external base 3 facing downwardly and the indexable mask interposed.

After the emitter and base material stripes 5 and 7 have been applied an optional but preferred step of evaporating silicon oxide ($SiO$ or $SiO_2$) over the wafer 1 and the applied stripes is performed. This is accomplished by vacuum evaporation, performed for example by downward vapor-phase deposition of the silicon monoxide or dioxide from a heated perforated tantalum strip to the surfaces of wafer 1 (preferably heated to about 200° C.) positioned therebelow. The thickness of the silicon oxide coating is preferably in the order of 500–1000 A. which can be ascertained by the color of the coating as dark yellow in the first order. This optional silicon oxide coating step restrains the stripes from wetting the wafer surface and thus inhibits these stripes from spreading and substantially changing the distance S between the stripes which would tend to degrade the ultimate device characteristics.

The wafer with the applied stripes or dots is then heated to effect alloy diffusion at temperatures in the order of approximately 680° C.–8.15° C. for a time in the order of about 2–35 minutes in a forming gas such as hydrogen, argon, nitrogen, helium or a mixture of nitrogen with 10% hydrogen by volume. The wafers may be supported during this step in any customary way, such as in a quartz or tantalum boat. The cooling rate may be varied considerably, e.g., from a quick quench to a slow cool of 1° C./min. for cooling times of 2–20 minutes. The temperature of the assembly of wafer 1 and composition stripes 5 and 7 during this alloy-diffusion step may be varied considerably, depending on the particular electrical characteristics and function to be required of the transistor being fabricated. For example, 740° C. would be desirable for manufacturing a VHF/UHF device having an $f_T$ of around 600 mc., while a somewhat lower alloy-diffusion temperature of about 700° C. is desirable where the $f_T$ of the device being fabricated is about 2000 mc. For fast switch type devices this temperature would be about 785° C. and as stated above, gold would be included in the base contact composition 7.

During this alloy-diffusion step, the faster diffusion N-type impurity penetrates into the P-type germanium substrate from the emitter melt and forms an N-type diffusion front 9 (FIGURE 4) which projects downwardly through the external base layer 3 thereby forming an internal base layer 8 of closely controlled thickness after cooling. The P-type impurity, which is slower in diffusing, and the aluminum form a P-type emitter region in contact with and superposed in internal base 8. This emitter region includes a lower P-type diffused zone 5*c* (with a preponderance of the P-type diffusant and a minor amount of the N-type impurity) and a P-type emitter regrowth area 5*b* (which includes aluminum and germanium plus some of the P- and N-type impurities but is principally aluminum-germanium regrowth material). In surface contact with the emitter 5*b*, 5*c*, is an emitter contact 5*a* which is the resolidified emitter melt less the aluminum and N- and P-type impurities which have diffused therefrom. Assuming that the emitter composition 5, which includes the component for forming the internal base, is constituted by aluminum, gallium and antimony, the aluminum-germanium regrowth area 5*b* and the zone 5*c* with its preponderance of gallium and minor amounts of antimony will be the emitter. The gallium serves as a dilution agent for the antimony and prevents complete formation of the compound aluminum antimonide (gallium antimonide is also formed during this alloy diffusion) but at the temperatures of 680° C.–815° C. this compound is generally molten and free antimony is therefore not prevented from being present in the melt for diffusion into the germanium substrate. Thus, an emitter-base diode is formed at the interfaces of internal base layer 8 and zone 5*c*, while a base-collector diode is formed at the interface indicated at 9.

The base contact material 7 also melts during this alloy-diffusion step and the fast diffusing N-type dopant (in this silver and N-type impurity composition with or without gold) diffuses into the substrate and forms a diffusion front 11 projecting downwardly into the P-type germanium substrate through the external base 3. Upon cooling, the resolidified composition 7 constitutes a good ohmic base contact superposed on and in contact with an N-type diffused region or layer 13.

After this alloy-diffusion step is completed, assuming the optional silicon oxide coating step has been employed, this coating is removed by conventional hydrofluoric acid treatment and rinsing. The slice or wafer is then mesa-masked in the customary fashion by using a photosensitive metal etch resist, and mesa etched to relieve the edges as indicated at 17 and thereby form the mesa. T collector contact layer 15 (e.g., gold with about 0.5–15% of a P-type dopant) is applied to the opposite or undersurface of water 1 as illustrated in FIGURE 5. The wafer is then scribed, diced, mounted, and leads attached to the emitter, base collector contacts using conventional techniques.

To supplement the above example of a process of the present invention, the following condensed process step description with additional process details is included. A bar of 1.5–1.8 ohm-cm. P-type germanium (crystal orientation 1–1–0) was utilized as starting material. The bar was cut to 12 mils, lapped to 8 mils, and chemically polished to 4 mils thickness. The following etching solution was used for chemical polishing:

3.5 parts con. $HNO_3$ (70.5%)
1.9 parts glacial acetic acid
1.0 part con. HF (48%)

A two-zone hydrogen carrier gas system was used in the prediffusion step of forming the external base 3 (FIGURE 2):

| | |
|---|---|
| Dope source | 1.5±0.3 grams arsenic. |
| Dope temp. | 400±2° C. |
| Slice temp. | 690±2° C. |
| Time | 35 min. |
| Gas flow | 1.0 l./m. $H_2$ in 2⅛" diam. tube. |
| Purge | 5 min. with forming gas. |
| Sheet resistivity | 13Ω/□. |
| Junction depth | 0.07 mil. |

Slice preparation for evaporation of the emitter and base contact compositions was 2 min. in 30% $H_2O_2$ at 25° C. The following material was used for evaporation to form composition 5:

150 mg. of Al-Ga (95%–5%)
15 mg. of pure Sb

The following material was used for evaporation to form the base contact composition 7:

180 mg. of Ag-Au-Sb (80–15–5%)
5 mg. of pure Sb

Evaporation was made through a single slot mask of 0.5 x 1.5 mil size. Mechanical indexing was used for displacing one stripe from another a distance of 0.5 to 1.0 mil. The emitter composition was evaporated first. The conditions during the evaporation step were:

| | |
|---|---|
| Slice temp. | 200° C. |
| Outgas | 300° C. for 10 min. |
| Firing pressure | $2\times10^{-5}$ mm. Hg. |
| Filament distance | 3.25". |

The optional silicon oxide evaporation step used a perforated tantalum filament, and evaporation was downward. Slices were placed (stripes up) on a stainless steel plate which rested on a ceramic heater. The temperature was controlled at 200° C. during SiO firing. Firing was made until a dark yellow layer in the first order was seen. The layer thickness at this point was ≈800 A.

The following were the conditions during the alloy diffusion step:

| | |
|---|---|
| Temperature | 740±2° C. |
| Time | 8 min. |
| Slow cool | 3° C./min. for 10 min. then quench. |
| Gas flow | 2.0 l./m. forming gas in 1.5" diam. tube. |
| Boat | Tantalum. |

The following steps were followed to effect removal of the silicon oxide coating:

(1) Submerge in con. HF, 25 min., 25° C.
(2) Swab with con. HF
(3) Rinse in deionized water
(4) Submerge in 30% $H_2O_2$, 25° C., 40 sec.
(5) Swab with 30% $H_2O_2$, 30 sec. and then rinse again in deionized water A conventional photo etch process was used to effect mesa masking with a photosensitive resist which was then selectively exposed so that a 3.0 x 3.0 mil mesa was etched on the upper surface of the wafer. The mesa etch used was as follows:

1 part of 30% $H_2O_2$
1 part glacial acetic acid
1 part con. HF (48%)

Mesa etch time was 12.0 seconds at 25° C.

A composition of Au-Ga (85–15%) was evaporated on the back side of the wafer after mesa etching to form the collector contact.

The slice or large wafer was scribed and diced to form 15 mil squares. The smaller wafers or dice were mounted on acid gold plated or cyanide gold plated headers in a chain furnace with a hydrogen atmosphere. Peak temperature that was seen by the dice was ≈380° C. Pure gold wires of 0.0003" diameter were thermal compression bonded between the header posts and the individual base and emitter stripes. Chisel base was ≈0.0003" in width. The final clean-up etching consisted of:

(1) Rinsing in running deionized $H_2O$ for 30 sec. at 25° C.
(2) Etching in 30% $H_2O_2$ for 15 sec. at 65° C.
(3) Rinsing in running deionized $H_2O$ for 30 sec. at 25° C.
(4) Etching in 30% $H_2O_2$ for 15 sec. at 65° C.
(5) Rinsing in running deionized $H_2O$ 15 sec. at 25° C.
(6) Rinsing in methyl alcohol 10 sec. at 25° C.
(7) Rinsing in trichloroethylene 10 sec. at 25° C.

This was followed by baking at 120° C. for 16 hours in a circulating air oven. This pre-can baking was then followed by a post-can baking at 100° C. for 100 hours for device stabilization.

Devices made in accordance with the above example had the following characteristics:

| Parameter | Best 10% | Median |
|---|---|---|
| 200 mc. noise fig. ($I_C$=−2 ma.; $V_{CE}$=−6 v.) ___db__ | 1.8 | 2.8 |
| hfe. at 200 mc. (given in $f_T$) ($I_C$=−2 ma.; $V_{CE}$=−6 v.) ___mc__ | 720 | 580 |
| r′ b. $C_C$ ($I_C$=−2 ma.; $V_{CE}$=−6 v.) ___psec__ | 2.5 | 3.2 |
| $BV_{CEO}$ ___v__ | 30 | 28 |
| $BV_{EBO}$ ___v__ | 1.4 | 1.2 |

In addition to the aforementioned uses or applications of the transistors of the present invention, UHF devices which will operate at frequencies of 2–5K mc. have been successfully fabricated. The operating characteristics and parameters of these devices may be varied as desired to predetermined values by controlling the physical size and spacings of the stripes of compositions 5 and 7; the thickness of the internal base layer 9 (i.e., the dimension between the bottom of the P-type diffused zone 5c and the interface or junction indicated at 9 between the internal base and the germanium substrate); the base diffusion profile (i.e., the concentration of the antimony, arsenic or equivalent N-type impurity in the external base 3); and the parent resistivity of the wafer.

An alternate but less preferred method of the present invention is illustrated in FIGURES 6–8. This process differs from that described above in one essential respect, viz., an external base as indicated at 3 in FIGURES 2–5 is not employed. Otherwise the processing steps are the same. The alloy-diffusion step in this alternate process embodiment effects a joinder between the N-type dopants in both the emitter and base contact compositions 5 and 7 as they penetrate and diffuse inwardly into the P-type germanium substrate and outwardly from the emitter and base contact melts. In this alternate fabrication process it is preferred to increase somewhat the concentration of the N-type dopant in the base contact material 7 to insure this joinder. It will be noted in FIGURE 6 that the layer formation of the components of the compositions 5 and 7 constituting the stripes are represented in detail.

In view of the above, it will be seen that the several objects of the invention are achieved and other advantageous results attained.

As various changes could be made in the above structures and methods without departing from the scope of the invention, it is intended that all matter contained in the above description or shown in the accompanying drawings shall be interpreted as illustrative and not in a limiting sense.

What is claimed is:

1. In a process for fabricating a germanium transistor, the steps comprising:

applying to a first portion of one surface of a germanium wafer having a P-type substrate a first composition adapted to form an emitter and which includes aluminum as a major constituent, another P-type impurity, and an N-type impurity having the property of diffusing into germanium faster than said P-type impurity, applying to a second portion of said wafer surface, closely adjacent but spaced away from said first portion, a second composition adapted to form a base contact and which includes silver and an N-type impurity, and heating said wafer and applied compositions to a temperature above the melting point of said impurities and said aluminum but below the melting point of germanium to diffuse the components of said compositions into said wafer whereby said N-type impurity in said first composition forms an N-type diffusion front which penetrates into said P-type substrate and constitutes an internal base layer and a P-type region is formed in contact with and superposed on said base layer and comprises an emitter, and whereby said second composition concurrently diffuses into said wafer to form an N-type region which penetrates into said substrate with a base contact superposed thereon.

2. A process as set forth in claim 1 which further includes an initial step of forming a thin external base layer of N-type conductivity on said first surface of said wafer.

3. A process as set forth in claim 2 in which said external base layer is formed by diffusion of an N-type impurity into said one surface.

4. A process as set forth in claim 1 wherein the first and second compositions are applied to said one wafer surface by sequentially evaporating respectively on said first and second surface portions a first material consisting essentially of said first composition and a second material consisting essentially of said second composition.

5. A process as set forth in claim 1 wherein the first composition is applied to said first wafer surface portion by sequentially evaporating first the N-type impurity, then said P-type impurity and then said aluminum component on said first surface portion.

6. A process as set forth in claim 5 wherein the second composition is applied to said second surface portion by sequentially evaporating on said second surface portion first said N-type impurity and then said silver component.

7. A process as set forth in claim 2 which includes a further step of applying a thin coating of a silicon oxide over said first and second compositions after their application to said wafer surface but before said heating step.

8. A process as set forth in claim 5 wherein said first composition comprises between approximately 20%–80% by weight of aluminum, between 0%–60% silver by weight, between approximately 0.01%–10% by weight of a P-type dopant selected from the group consisting of gallium, indium and mixtures thereof, and between approximately 0.2%–20% by weight of an N-type dopant selected from the group consisting of phosphorus, arsenic and antimony, and wherein said second composition comprises between approximately 0.5%–5% by weight of an N-type dopant selected from the group consisting of phosphorus, arsenic and antimony and the balance of said second composition comprises a metallic component selected from the group consisting of silver and a mixture of silver and gold.

9. A process as set forth in claim 7 wherein said N-type impurity used in forming said thin external base is arsenic and said external base is approximately 0.05 mil thick, and wherein said first composition comprises approximately 80% by weight of aluminum, approximately 5% by weight of gallium and approximately 15% by weight of antimony, and wherein said second composition comprises approximately 85% by weight of silver, approximately 10% by weight of gold, and approximately 5% by weight of antimony.

10. A process as set forth in claim 9 in which first and second compositions are sequentially applied respectively to said first and second portions of the wafer surface by evaporating a material of said first composition through a slit in an indexable mask, and then after shifting said mask to a position in registry with said second portion evaporating a material of said second composition through said slit.

11. In a process for fabricating a germanium transistor, the steps comprising:

forming a shallow N-type region on P-type germanium region, applying to a first portion of a surface of said N-type region a first composition adapted to form an emitter and which includes aluminum as a major constituent, another P-type impurity, and an N-type impurity having the property of diffusing into germanium faster than said P-type impurity, applying to a second portion of said surface of the N-type region, closely adjacent but spaced away from said first portion, a second composition adapted to form a base contact and which includes a metal and an N-type impurity, and heating said regions and applied compositions to a temperature above the melting point of said impurities and said aluminum but below the melting point of germanium to fuse the said compositions to said germanium and whereby said N-type impurity in said first composition forms an N-type diffusion front which penetrates into said P-type region and constitutes an internal base layer and a P-type region is formed in contact with and superposed on said base layer and comprises an emitter, and whereby said second composition concurrently diffuses into said wafer to form an N-type region which penetrates into said P-type region with a base contact superposed thereon.

References Cited by the Examiner

UNITED STATES PATENTS

| | | | |
|---|---|---|---|
| 2,836,521 | 5/1958 | Longini | 148—178 |
| 2,943,006 | 6/1960 | Henkels | 148—178 |
| 3,001,895 | 9/1961 | Schwartz et al. | 148—178 |
| 3,074,826 | 1/1963 | Tummers | 148—178 |

DAVID L. RECK, *Primary Examiner.*

R. O. DEAN, *Assistant Examiner.*

UNITED STATES PATENT OFFICE
CERTIFICATE OF CORRECTION

Patent No. 3,268,375 August 23, 1966

Gordon J. Ratcliff et al.

It is hereby certified that error appears in the above numbered patent requiring correction and that the said Letters Patent should read as corrected below.

Column 1, lines 46 and 49, for "fT", each occurrence, read -- $f_T$ --; column 2, line 48, for "discussion" read -- diffusion --; column 4, line 70, for "680° C.-8.15° C." read -- 680° C.-815° C. --; column 5, line 64, for "T" read -- A --; line 66, for "water" read -- wafer --; line 68, after "base" insert -- and --; column 6, line 14, for "l./m." read -- L/M --.

Signed and sealed this 10th day of October 1967.

(SEAL)
Attest:

Edward M. Fletcher, Jr.
Attesting Officer

EDWARD J. BRENNER
Commissioner of Patents